(12) United States Patent
Leendertsen

(10) Patent No.: US 6,200,632 B1
(45) Date of Patent: Mar. 13, 2001

(54) METHODS AND APPARATUS FOR APPLYING LIQUID FLUOROPOLYMER SOLUTIONS TO SUBSTRATES

(76) Inventor: Howard V. Leendertsen, 405 Shoreland Dr., Bellevue, WA (US) 98004

( * ) Notice: Subject to any disclaimer, the term of this patent is extended or adjusted under 35 U.S.C. 154(b) by 0 days.

(21) Appl. No.: 09/362,629

(22) Filed: Jul. 21, 1999

Related U.S. Application Data

(62) Division of application No. 08/810,272, filed on Mar. 4, 1997, now Pat. No. 6,007,626.
(51) Int. Cl.[7] ....................................................... B05D 7/22
(52) U.S. Cl. .................. 427/230; 427/388.1; 427/385.5; 427/239
(58) Field of Search ..................................... 427/230, 236, 427/239, 388.1, 385.5

(56) References Cited

U.S. PATENT DOCUMENTS

| | | | |
|---|---|---|---|
| 5,478,905 | * | 12/1995 | Anolick et al. ........................ 526/254 |
| 5,637,663 | * | 6/1997 | Anolick et al. ........................ 526/254 |

* cited by examiner

*Primary Examiner*—Shrive Beck
*Assistant Examiner*—Michael Cleveland
(74) *Attorney, Agent, or Firm*—McDonnell Boehnan Hulbert & Berghoff

(57) ABSTRACT

This invention is an apparatus and a method for applying a very thin film of fluoropolymer to a substrate, and more particularly, to a substrate surface that is a heat transfer, aerodynamic, and hydrodynamic substrates. This invention is also a substrate including an extremely thin film of fluoropolymer.

7 Claims, 4 Drawing Sheets

METHODS AND APPARATUS FOR APPLYING LIQUID FLUOROPOLYMER SOLUTIONS TO SUBSTRATES

"This is a divisional application of U.S. patent application Ser. No. 08/810,272 filed on Mar. 4, 1997, now U.S. Pat. No. 6,007,626."

BACKGROUND OF THE INVENTION

(1) Field of the Invention

This invention concerns novel methods for applying and using liquid fluoropolymer containing solutions. More specifically, this invention concerns methods for applying a fluoropolymer solution to a substrate and thereafter removing the liquid carrier from the solution to give substrates coated with a durable fluoropolymer film. The thin, durable fluoropolymer film is useful as a corrosion inhibiting agent, as a heat transfer promoter, and as an adhesion barrier. In addition, this invention is an apparatus that is useful for applying a thin coating of fluoropolymer to the internal surfaces of a heat exchanger.

(2) Prior Art

The prior art discloses soluble fluoropolymer solutions. For example, U.S. Pat. No. 5,459,191 discloses solvents that are useful for manufacturing perfluorinated fluoropolymer solutions. The '191 patent further discloses that such perfluorinated fluoropolymer solutions are useful to coat electronic components.

U.S. Pat. No. 4,446,269 discloses solutions of fluoropolymers. The solutions are disclosed as being useful in the manufacture of liquid permeation membranes.

While solutions of fluoropolymers are known in the art, there remains a need to find new uses for the solutions. In addition, there is a need for improving the heat transfer capabilities of substrates.

SUMMARY OF THE INVENTION

This invention is a new method for using a fluoropolymer solution to form a corrosion barrier/heat transfer promoting film on a substrate. In addition, this invention is a new method for using a fluoropolymer solution to form an adhesion barrier film on metal and non-metal substrates.

This invention is also a heat transfer surface coated with a thin durable fluoropolymer film that is prepared by applying a fluoropolymer solution to a metal or non-metal substrate to give a substrate coated with a very thin layer of fluoropolymer.

In addition, this invention is a substrate coated with a fluoropolymer film having a thickness of from about 0.1 microns to about 10.0 microns or more.

This invention is also a method for applying a thin layer of fluoropolymer to the internal and/or external surfaces of a heat exchanger such as, but not limited to, radiators, air liquid heat exchangers, liquid coolers, liquid heaters and coolers, gas heaters and coolers, and any other existing heat exchangers as well as heat exchangers developed in the future.

In another aspect, this invention is an antifreeze solution including a soluble fluoropolymer dispersion that protects the internal radiator heat transfer surfaces from corrosion and scum accumulation.

Yet another object of this invention is an apparatus that is useful for coating the internal surface of a heat exchanger with a fluoropolymer coating.

Still another object of this invention is a method for coating the internal surface of a heat exchanger with a fluoropolymer.

In one embodiment, this invention is a method for applying a fluoropolymer coating to a substrate. The method is accomplished by preparing a fluoropolymer solution comprising from about 0.1 to about 20.0 weight percent fluoropolymer. The fluoropolymer solution is then applied to a substrate to give a fluoropolymer coated substrate. Finally, the fluoropolymer coated substrate is cured to give a fluoropolymer film coated substrate.

In another embodiment, this invention is a method for applying a fluoropolymer coating to the internal surfaces of a heat exchanger having a hollow interior, a fluid inlet, and a fluid outlet. The hollow heat exchanger is coated by directing a flushing solution into the heat exchanger inlet, through the hollow interior of the heat exchanger and out of the heat exchanger outlet to give a flushed heat exchanger. The flushing solution is then removed from the flushed hollow heat exchanger and air is introduced into the cleaned hollow heat exchanger to give an essentially dry hollow heat exchanger. A fluoropolymer solution is introduced into the essentially dry hollow heat exchanger and the fluoropolymer solution is circulated through the heat exchanger for a period of time sufficient to give a fluoropolymer coated heat exchanger. The fluoropolymer solution is withdrawn from the fluoropolymer coated heat exchanger, and air is introduced into the fluoropolymer coated radiator for a period of time sufficient to give a fluoropolymer film coated heat exchanger.

In yet another embodiment, this invention is a fluoropolymer film coated heat exchanger whereby the fluoropolymer film is applied by methods of this invention.

In still another embodiment, this invention is an apparatus useful for applying a thin fluoropolymer film coating onto the inner hollow surface of a heat exchanger. The apparatus includes a first storage tank for containing a flushing solution; a first pump having an inlet associated with the first storage tank and an outlet associated with a first flexible hose inlet, the flexible hose including an outlet for association with a hollow heat exchanger inlet; a blower associated with the first flexible hose; a second storage tank for containing a fluoropolymer solution including an outlet; a second pump including an inlet associated with the second storage tank outlet and an outlet associated with the first conduit; a second flexible hose including an inlet associated with a hollow heat exchanger outlet, and an outlet associated with a piping manifold; and a piping manifold for uniting first storage tank, second storage tank, first pump, second pump, and blower with first flexible hose and with second flexible hose.

DESCRIPTION OF THE CURRENT EMBODIMENT

Figure 1:
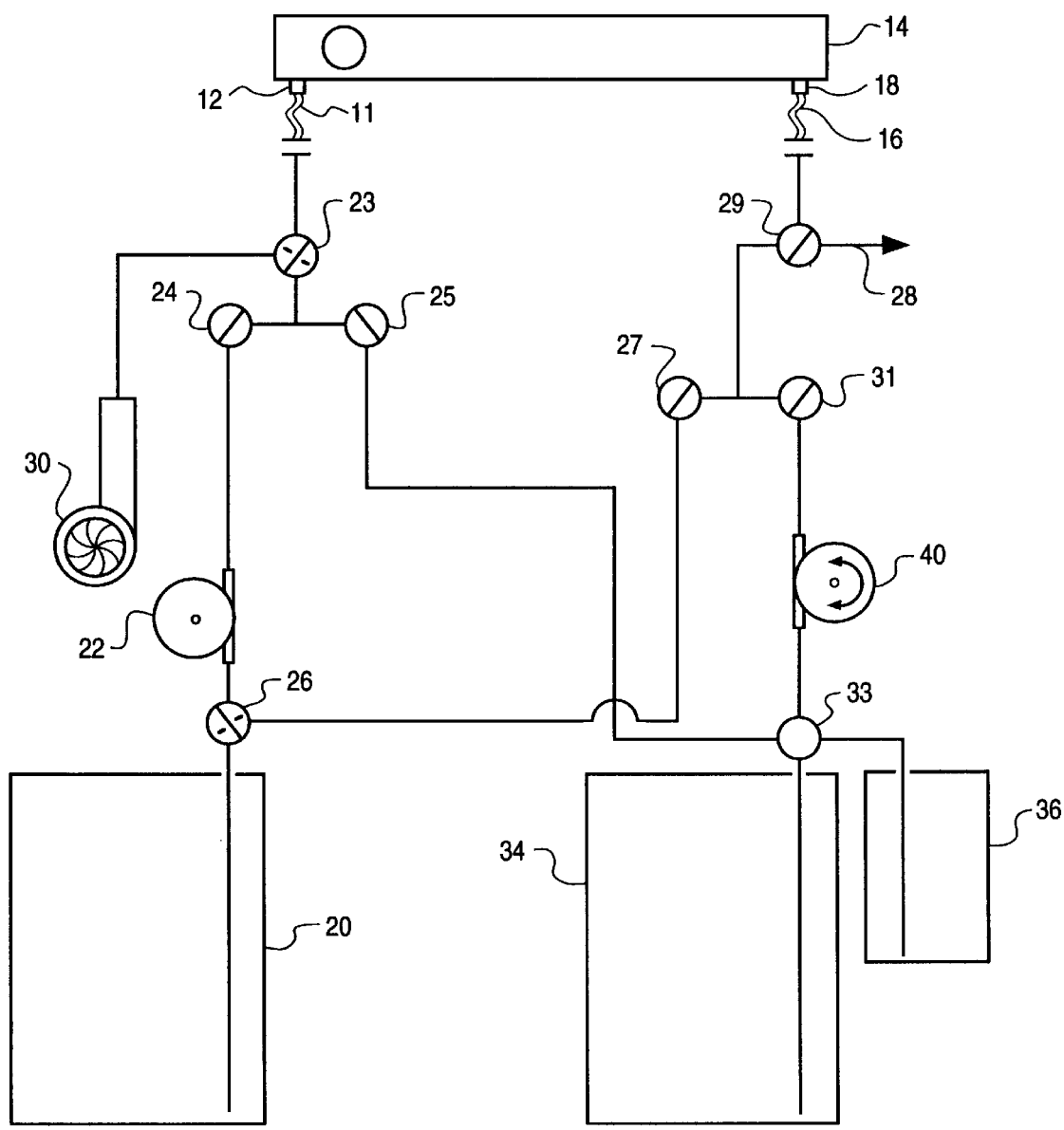
FIG. 1 is a schematic flow diagram of an apparatus and process of this invention for coating the internal surfaces of a heat exchanger with a fluoropolymer coating.

The present invention relates to methods for using a fluoropolymer solution to coat a substrate with a very thin fluoropolymer film coating to enhance heat transfer, to provide an adhesion barrier, and to provide a corrosion inhibiting layer. This invention also relates to an apparatus that is especially designed to apply a thin uniform coating of fluoropolymer film to a substrate.

This invention derives in part from the discovery that liquid fluoropolymer solutions can be applied to substrates to give very thin fluoropolymer film layers. The resulting thin, fluoropolymer coating has been discovered to be useful in applications heretofore never considered. One application, for example, is the use of liquid fluoropolymers to coat heat transfer surfaces such as the internal surface or external surface of heat exchangers, such as shell and tube heat exchangers, air cooled heat exchangers, finned heat exchangers, radiators, oil coolers, oil heaters, elements of heat exchangers, and so forth.

The application of a thin film of fluoropolymer to promote heat transfer is counterintuitive. Adding any type of a film to a heat transfer surface would be understood to inhibit and not enhance heat transfer. However, a thin fluoropolymer film actually can enhance heat transfer immediately and over time. A thin film of fluoropolymer when applied to a heat transfer substrate inhibits corrosion of the substrate surface, and it inhibits adhesion of particles and materials onto the substrate surface that may inhibit heat transfer. Furthermore, in many applications, the fluoropolymer film acts as a lubricant to enhance heat transfer by allowing heat transfer fluids to move more efficiently and with less friction through heat transfer apparatuses. This is especially important where the heat exchanger is used to heat or to cool viscous solutions the flow rate of which at a set pressure drop across the heat exchanger can be significantly improved by coating the heat exchanger surfaces with a fluoropolymer film. Therefore, initially, and over time, fluoropolymer films improve fluid flow and reduce the degradation of heat transfer caused by corrosion build-up or by the accumulation of heat transfer inhibitory compounds and particles on the surfaces of the heat transfer substrate. Most importantly, an extremely thin fluoropolymer film is sufficient to inhibit corrosion and scum accumulation with little if any impact on heat transfer driving forces.

For purposes of the description of the inventions herein, the term "fluoropolymer solution" refers to both a liquid in which a fluoropolymer is dissolved, and to a liquid in which a particulate fluoropolymer is dispersed.

For purposes of the description of the inventions herein, the term "fluoropolymer" refers to any fluoropolymer or fluoropolymer containing compound that can be solubilized or dispersed in a solution including, but not limited to, PTFE, fluorocarbon polymers, a fluorocarbon polymers containing at least one co-polymer, TFE, TFE and co-monomers of TFE, and mixtures thereof Fluoropolymers solutions useful for preparing fluoropolymer coated substrates may be any solution of soluble or dispersed fluoropolymer. An example of a useful solution of soluble fluoropolymer is disclosed in U.S. Pat. No. 5,459, 191 which is incorporated herein by reference. Other examples of liquid fluoropolymer solutions that are useful to give fluoropolymer coated substrates are disclosed in U.S. Pat. Nos. 4,360,388 and 3,461,129.

Fluoropolymer film coated substrates that fall within the scope of this invention may be any substrate surface that is used as or that is a part of a heat transfer, aerodynamic, or hydrodynamic surface. The substrate may be manufactured from metal, plastic, engineered materials such as carbon fiber laminants or any other material that is compatible with a fluoropolymer film. This invention is not limited to the application of a solution of fluoropolymer to a heat transfer substrate to give a fluoropolymer coated substrate surface. This invention is broader, and includes the application of a fluoropolymer solution to heat transfer surfaces, to aerodynamic drag surfaces, to hydrodynamic surfaces, and to any other surfaces and substrates upon which the buildup of corrosion and particulate matter is undesirable. For example, a fluoropolymer solution can be applied to aerodynamic surfaces of airplanes, helicopters, racing cars, high speed trains and so forth, to prevent the accumulation of debris, foreign material, debris, ice and other foreign objects that would make an airplane heavier or reduce the efficiency of the aerodynamic surfaces.

Substrates may be coated or encapsulated with fluoropolymer solutions by any method known to one skilled in the art for applying a coating to a substrate. Examples of application methods include by dipping, by spraying, by painting, by circulating fluid through hollow substrates and so forth. Once a fluoropolymer solution has been applied to a substrate, excess solution is removed and the substrate is cured to give a fluoropolymer film coated substrate.

Fluoropolymer solutions are especially useful for coating or encapsulating objects with complex shapes which cannot be easily encapsulated (particularly without gas pockets) by other methods. It is preferred that during the coating or encapsulation process that the object being coated or encapsulated is heated to the approximate fluoropolymer solution temperature before being contacted with the fluoropolymer solution.

Once a layer of fluoropolymer solution has been applied to a substrate, the liquid carrier (solvent or dispersant) will be removed from the fluoropolymer by evaporation, by heating, or by any other method that is capable of volatilizing the liquid carrier in a manner that leaves a thin uniform film of fluoropolymer on the substrate. It is preferred that the curing step occur at a temperature above the glass transition temperature of the fluoropolymer that is being applied to the substrate in order to cause the fluoropolymer to form a thin uniform film on the coated substrate.

It is preferred that the fluoropolymer solution is applied to substrates to give a substrate with a very thin and preferably a uniform mono-molecular film of fluoropolymer. This is especially preferred when the liquid fluoropolymer is applied to a heat transfer surface to give a fluoropolymer coated heat transfer substrate. I have discovered that a fluoropolymer solution can be applied to give a substrate coated with a fluoropolymer film that is from about 0.1 to about 10 microns or more in thickness. More preferably, the applied fluoropolymer film will have a thickness of from 0.5 to about 2.0 microns. A film with the preferred thickness will generally be pinhole free and it will not inhibit heat transfer in a heat transfer apparatus nor will it contribute significantly to the weight of an aerodynamic or heat transfer substrate. At this preferred thickness, the fluoropolymer layer has little detrimental effect on heat transfer driving forces while having a very positive effect on inhibiting corrosion and the buildup of heat transfer inhibiting foreign material on a substrate surface.

One particularly preferred application is the use of a liquid fluoropolymer solution to coat the internal and/or external surfaces of a radiator associated with an internal combustion engine, or associated with any other application that requires a radiator. The fluoropolymer coating is believed to work, in part, by inhibiting the accumulation of particles and other heat transfer reducing agents on the external and internal radiator surfaces and it also prevents the accumulation of corrosion on the internal surfaces of the radiator, thereby maintaining high heat transfer efficiencies over a long period of time.

A liquid fluoropolymer solution may be applied to the internal and/or external surfaces of an internal combustion engine radiator by chemical vapor deposition, by dipping, or by circulating a fluoropolymer containing solution through the internal spaces of a radiator. Prior to the construction of an IC engine including the radiator, the radiator surfaces including the radiator core can be coated with a fluoropolymer solution by (chemical) vapor deposition. Alternately, once a radiator is installed and used, the internal surfaces of a radiator can still be coated with a fluoropolymer film by draining the fluid from the radiator and cooling system, adding a fluoropolymer solution to the heating or cooling system, circulating the fluoropolymer solution through the radiator for a period of time and thereafter draining the solution from the radiator and allowing the internal surfaces of the radiator to cure in a manner that volatilizes the liquid carrier and leaves a thin coating of a fluoropolymer film on the internal radiator surfaces. A preferred process and apparatus for carrying out this method is described in more detail below with reference to FIGS. 1–5.

In another embodiment of this invention, the internal surfaces of a heat exchanger may be coated with a thin layer of fluoropolymer by incorporating a fluoropolymer solution into a compatible heat transfer liquid. As the fluoropolymer containing heat transfer liquid circulates throughout the heat exchanger, the fluoropolymer in the circulating solution will slowly coat the internal surfaces of the heat exchanger thereby improving heat transfer by inhibiting corrosion by inhibiting the accumulation of sludge on the internal surfaces of the heat exchanger and by promoting fluid flow through the heat exchanger.

The application of a very thin fluoropolymer coating on a substrate is preferably accomplished by varying the weight percent concentration of fluoropolymer in the solution applied to the substrate. The fluoropolymer solution may contain from about 0.1 to about 20 weight percent fluoropolymer. However, it is preferred that the solution contain from about 0.5 to about 10.0 weight percent fluoropolymer when the fluoropolymer solution is applied to a heat transfer substrate and most preferably from about 0.5 to about 3.0 weight percent.

The fluoropolymer solution useful in the methods of this invention may include components that are useful in substrate coatings. One particularly useful class of compounds include lubricant compounds such as particulate aluminum nitride and/or any other compounds that are known to facilitate or inhibit heat transfer and fluid and gas flow.

A preferred class of compounds that may be combined with the soluble fluoropolymer composition either before or during the application of the solution to a substrate are compounds of Group IIIA elements for the Periodic Table of Elements. A preferred additive is aluminum nitride which is incorporated into the fluoropolymer solution as discrete particles that are small enough in size to facilitate their dispersion in the fluoropolymer solution. Aluminum nitride enhances the durability of the polymer film coating and is imparts lubricant and heat transfer properties to the film layer as well. It is preferred that the aluminum nitride has a particle size ranging from about 0.1 microns to about 250 microns, and more preferably from about 0.01 microns to about 25 microns. It is most preferred that the aluminum nitride particles have sizes ranging from about 0.1 microns to about 5 microns.

A fluoropolymer coating composition including one or more additives will preferably include from about 0.1 to about 20.0 weight percent of optional additives such as aluminum nitride, and preferably from about 1.0 to about 10.0 weight optional additives.

FIGS. 1–5 show various aspects of a preferred apparatus and method for applying a fluoropolymer coating to the internal surfaces of a heat exchanger. The apparatus shown in the figures is especially adapted for applying a fluoropolymer film to the internal surfaces of a radiator that is associated with an internal combustion engine of a automobile or other motorized vehicle. However, while described in terms of applying a fluoropolymer coating to a radiator, the apparatus and method described in FIGS. 1–5 are equally applicable to coating the internal surfaces of any type of heat exchanger so long as the heat exchanger has an inlet and a separate outlet that can be used in conjunction with the apparatus and method of FIGS. 1–5 to coat the internal surfaces of a heat exchanger with a fluoropolymer.

A preferred method and apparatus for coating radiator internals will be described with reference to FIGS. 1–5. The process begins by draining any liquid from radiator 14 and displacing the liquid with air or some other gas to give an empty radiator 14. Next, first flexible hose 11, associated with the outlet fluid circulation device 10, is connected to inlet 12 of radiator 14 and second flexible hose 16, associated with the inlet of fluid circulation device 10, is connected to outlet 18 of radiator 14. Generally, inlet 12 will be associated with the low fluid point of radiator 14 while outlet 18 is associated with a high fluid point of radiator 14 to provide for essentially complete displacement of air or gases from radiator by circulating fluid. However, the process and apparatus of this invention is useful even when inlet 12 is at a radiator high point and the outlet 18 is at the radiator low point.

Once fluid circulation device 10 is associated with radiator 14, fluid circulation device is used to flush the inside of radiator 14. Radiator 14 is flushed by introducing a flushing solution into radiator 14 and circulating the flushing solution through radiator 14 at conditions and for a period of time sufficient to remove at least some of the scale, sludge, and/or residual heat transfer fluid from radiator 14.

The flushing solution is located in first tank 20. The flushing solution may be any aqueous or non-aqueous solution that is capable of removing liquids such as ethylene glycol, scale, or rust from the inside of a radiator or other heat exchange device. Useful flushing solutions are aqueous and non-aqueous solutions. An example of a non-aqueous radiator flushing solution is Premium Cooling System Flush manufactured by Ford Motor Company and identified by Part No. Ford-US F1AZ-19A503A. The non-aqueous radiator flush included:

30–40 wt % Naphtha
25–35 wt % Isoproponol
10–20 wt % Ethylenglycol monobutyl ether
5–15 wt % Petroleum distilates
1–10 wt % Methyl alcohol
1–10 wt % Ethylene oxide-nonylphenol polymer An example of an aqueous radiator flushing solution is Goodwrench Cooling System Fast Flush, Part No. 12345580 manufactured by General Motors Co. The non-aqueous and aqueous flushing solutions can be used as purchased or they can be added to antifreeze solutions to give a radiator flush solution.

The flushing solution is withdrawn from first tank 20 by first pump 22 and directed through valves 23 and 24 and into radiator 14 via first flexible hose 11. The flushing solution passes through radiator 14 and exits radiator 14 via second flexible hose 16 whereupon the flushing solution is directed either back to first tank 20 via valves 26, 27 and 29 or the flushing solution may be recirculated back into radiator 14 to give a closed cleaning loop that omits first storage tank 20 from the recirculation loop.

Figure 2:
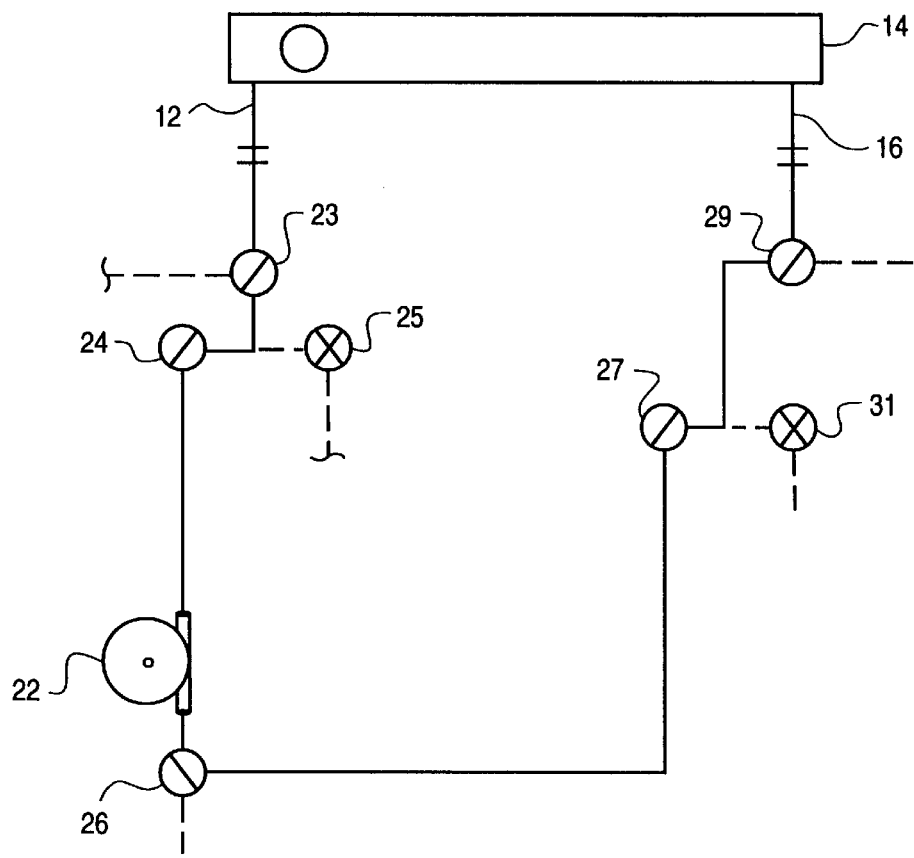
FIG. 2 is a schematic flow diagram of the closed loop cleaning circuit of an apparatus of this invention depicted in FIG. 1.

In a preferred method, enough flushing solution is pumped into radiator 14 to liquid fill the cleaning loop after which valve 26, a three-way valve, is actuated to circulate the flushing solution in a closed loop as shown in FIG. 2. The flushing solution is allowed to circulate through radiator 14 for from about 1 minute to 15 minutes or more and preferably from about 1 to about 5 minutes. Once flushing solution circulation is complete, the used flushing solution in the closed loop pumping system is directed back into first storage tank 20 or out drain 28. Because the used flushing solution will be contaminated by materials flushed from radiator 14, it is preferred that the flushing solution is directed set to drain 28, collected, and properly disposed of.

The flushing solution may be heated, cooled, or it may be used at room temperature. The flushing solution may be circulated through radiator 14 at elevated pressures. However, it is preferred that the flushing solution is circulated at a pressure of from about slightly above atmospheric pressure to about two atmospheres pressure.

After the flushing solution is removed from radiator 14, hot air is directed from blower 30 through air valve 23 and into radiator 14 in order to dry the internal surfaces of radiator 14 in preparation for application of a fluoropolymer film to the internal radiator surfaces. Heated air is directed through radiator 14 for a period of time sufficient to give an essentially dry radiator.

Figure 3:
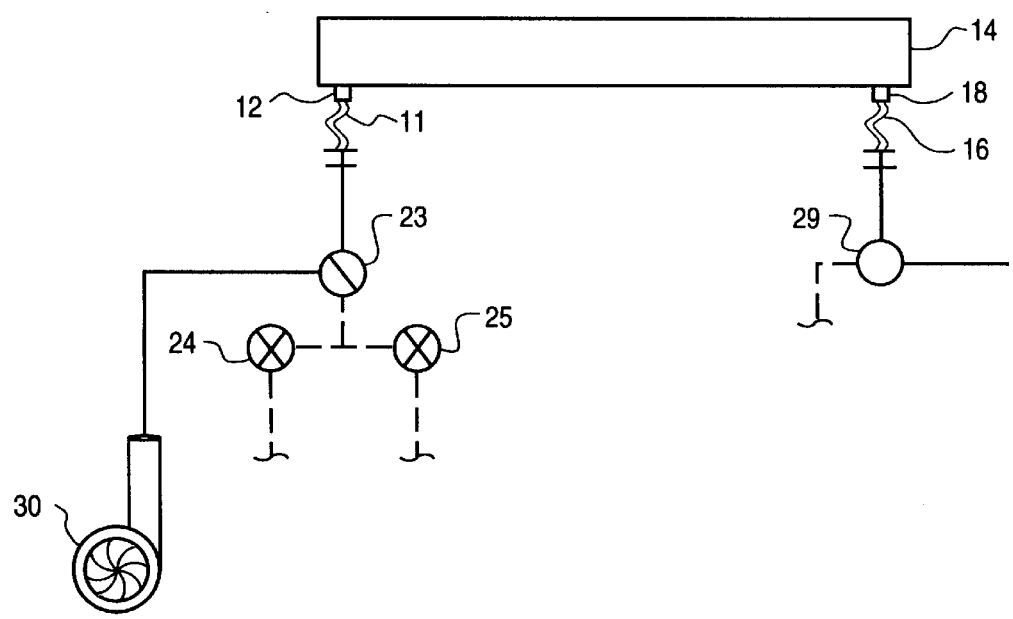
FIG. 3 is a schematic flow diagram of the air drying flow circuit of an apparatus of this invention depicted in FIG. 1.

A preferred heated air circulation loop is shown in FIG. 3. According to FIG. 3, heated air will is directed through radiator 14, through valve 29 and out vent 28 for a period of time ranging from about 1 to about 20 minutes or more and preferably from about 2 to about 10 minutes.

While the apparatus and process of FIG. 1 is described in terms of using blower 30 to direct hot air through radiator 14, it is within the scope of this invention to direct gases such as carbon dioxide, or helium through a heat exchanger such as a radiator in order to give a essentially dry heat exchanger. If special gases are used to dry radiator 14, then the gases will typically be supplied in pressurized cylinders. Also, if special gases are used, the process and apparatus of this invention can include a gas dryer to remove volatilized fluids from the gases in order to allow for the recirculation via compressor of cylinder supplied gases in a closed recirculation loop.

It is preferred that the air directed into radiator 14 is heated to a temperature sufficient to quickly dry the internal radiator surfaces without causing damage to any heat sensitive radiator parts. Therefore, the temperature of the air or gas that is directed through radiator 14 should not exceed the operating temperature of radiator 14. It is most preferred therefore, that the heated air have a temperature of from about 80° to about 180° F. or more.

The air that is directed into radiator 14 may be heated by any manner known to one skilled in the art. For example, the air may be heated by electric coils associated with blower 30, the blown air may be passed through a heater before entering radiator 14, or the air may be heated before it enters blower 30.

The essentially dry radiator 14 is then coated. A solution of fluoropolymer may be prepared by any manner known to one skilled in the art to give a fluoropolymer solution comprising from about 1 to about 20 weight percent fluoropolymer. For instance, the fluoropolymer solution may be premixed in the proper concentration and placed in a tank for circulation through radiator 14. Alternatively, as depicted in FIG. 1, a concentrated fluoropolymer solution can be held in a second supply tank 34 and combined with a diluting solution held in third supply tank 36 to give a circulating fluoropolymer solution having the desired fluoropolymer concentration.

Figure 4:
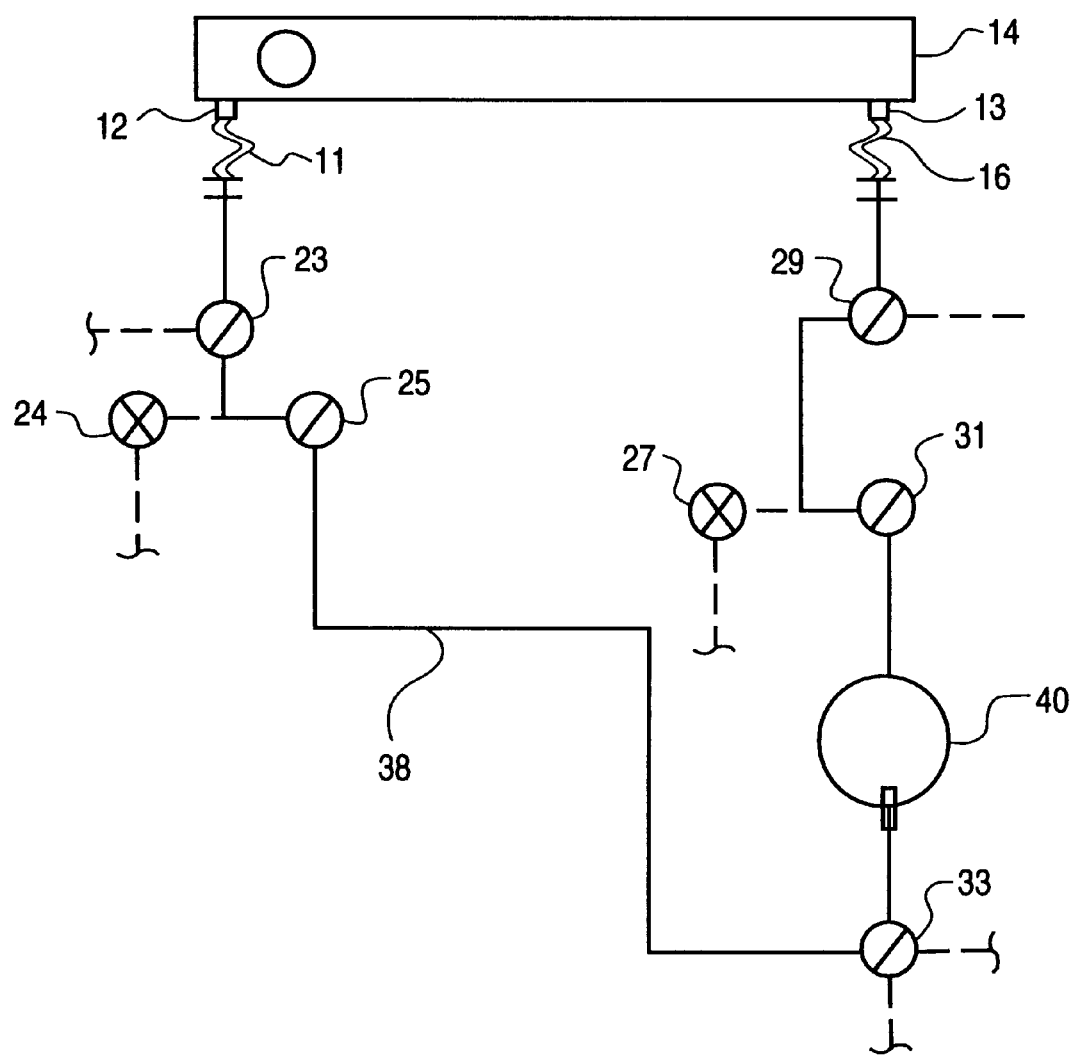
FIG. 4 is a schematic flow diagram of the fluoropolymer solution recirculation flow circuit of an apparatus of this invention depicted in FIG. 1.

A concentrated fluoropolymer solution is combined with a diluting solution by actuating three-way valve 33 so that third supply tank supplies concentrated liquid fluoropolymer to the suction of second pump 40. Second pump 40 pumps a predetermined amount of fluoropolymer solution from third supply tank 36 into the fluoropolymer circulation loop shown in FIG. 4. The amount of concentrated fluoropolymer need is predetermined taking into account the volume of radiator 14 being treated, the volume of the circulating loop, the concentration of the concentrated fluoropolymer, and the desired concentration of the circulating fluoropolymer. Three-way valve 33 is then actuated to isolate third supply tank 36 from the system and to direct diluting solution held in second supply tank 34 to the suction of second pump 40 thereby filling the remaining unfilled portions of the fluoropolymer circulation loop including radiator 14 with diluting solution. When radiator 14 and fluoropolymer circulating loop 36 shown in FIG. 4 are liquid filled with the fluoropolymer solution, three-way valve 33 is actuated to allow for circulation of the fluoropolymer solution in the fluoropolymer circulating loop 36. Second pump 40 circulates the fluoropolymer solution through radiator 14 for a period of time sufficient to allow fluoropolymer to adhere to the inner surfaces of radiator 14. Typically, the fluoropolymer solution will be circulated through radiator 14 for a period of time ranging from about 1 minute to about 30 minutes or more. It is preferred, however, to keep the fluoropolymer solution concentration high so that the fluoropolymer solution circulation time can be limited to from about 1 minute to about 10 or more and most preferably from about 2 minutes to about 7 minutes.

Once the fluoropolymer solution circulation is complete, the fluoropolymer solution is drained from radiator 14 and fluoropolymer circulation loop 38 to give a drained fluoropolymer solution coated radiator. The drained circulating solution can be returned to second supply tank 34, to third supply tank 36, or the solution can be directed to drain 28 for recovery and/or disposal.

The drained fluoropolymer solution coated radiator is dried a second time in order to cure the fluoropolymer and give a fluoropolymer film coated radiator. As in the first drying step above, blower 30 is used to direct heated air through the fluoropolymer treated radiator and out drain 28 in order to volatilize the solution in which the fluoropolymer is dissolved or dispersed. The blown air should be heated at least to a temperature sufficient to volatilize the solvent or solution diluting the fluoropolymer in a short period of time. It is preferred, that the heated air enters radiator 14 at a temperature that exceeds the glass transition temperature of the fluoropolymer that coats radiator 14 internal surfaces in order to cause the fluoropolymer to cure as a thin uniform fluoropolymer film. Thus, the heated air used in the second drying step should have a temperature ranging from about 100° to about 200° F. It is also preferred that the hot air is passed through fluoropolymer treated radiator for a period of time ranging from about 1 to about 20 minutes and most preferably from about 2 to about 10 minutes to give a fluoropolymer film coated radiator. Alternately, as in the first drying step described above, cylinder supplied gas can be heated and used to cure the fluoropolymer coated surfaces.

When the curing step is complete, blower 30 is shut off, first flexible hose 11 and second flexible hose 16 are detached from radiator 14, and the radiator is prepared for refilling with heating or cooling fluid as the case may be.

A coagulant may be used to facilitate the deposition of a thin film of fluoropolymer on a substrate such as an automobile radiator. Useful coagulants are any liquid that disrupts the solubility of a soluble fluoropolymer or that disrupts the dispersability of a fluoropolymer dispersion. Useful coagulants include glycols such as ethylene glycol and propylene glycol and other useful coagulants.

The coagulant is applied to a substrate as a solution prior to coating the substrate with the fluoropolymer solution to give a coagulant coated substrate. Thereafter, a fluoropolymer solution is applied to the coagulant coated substrate. When the coagulant coating is contacted by the fluoropolymer solution, at least some fluoropolymer coagulates at the interface of the two fluids to give an interface region where fluoropolymer has a greater concentration than in the fluoropolymer solution. After a short period of time, the substrate is separated from the fluoropolymer solution as by draining a radiator of fluoropolymer solution to give a substrate coated with coagulated fluoropolymer. The substrate is cured to give a fluoropolymer film coated substrate. By using a coagulant, it is possible to prepare a fluoropolymer film coated substrate using a fluoropolymer solution with a very low fluoropolymer concentration.

Referring to the process and apparatus described in FIGS. 1–5, an optional coagulant containing solution is circulated through radiator 14 following the flushing step, and prior to the fluoropolymer solution circulation step. The coagulant containing solution is drained from radiator 14 to give coagulant solution coated radiator internals. Next, the fluoropolymer solution is circulated through radiator 14 and the process proceeds as described above.

The apparatus described above in reference to FIGS. 1–5 may include a programmable controller for controlling the entire fluoropolymer coating process. If a programmable controller is used to operate the apparatus to fluoropolymer coat the internal surfaces of a radiator or other heat exchanger, then the controller may be associated with solenoids, temperature sensing devices, level controllers, timers, and other measurement and control devices in order to automate the apparatus and process described above. The integration of a programmable controller with the apparatus and process described above is within the scope of understanding of one skilled in the art.

Figure 5:
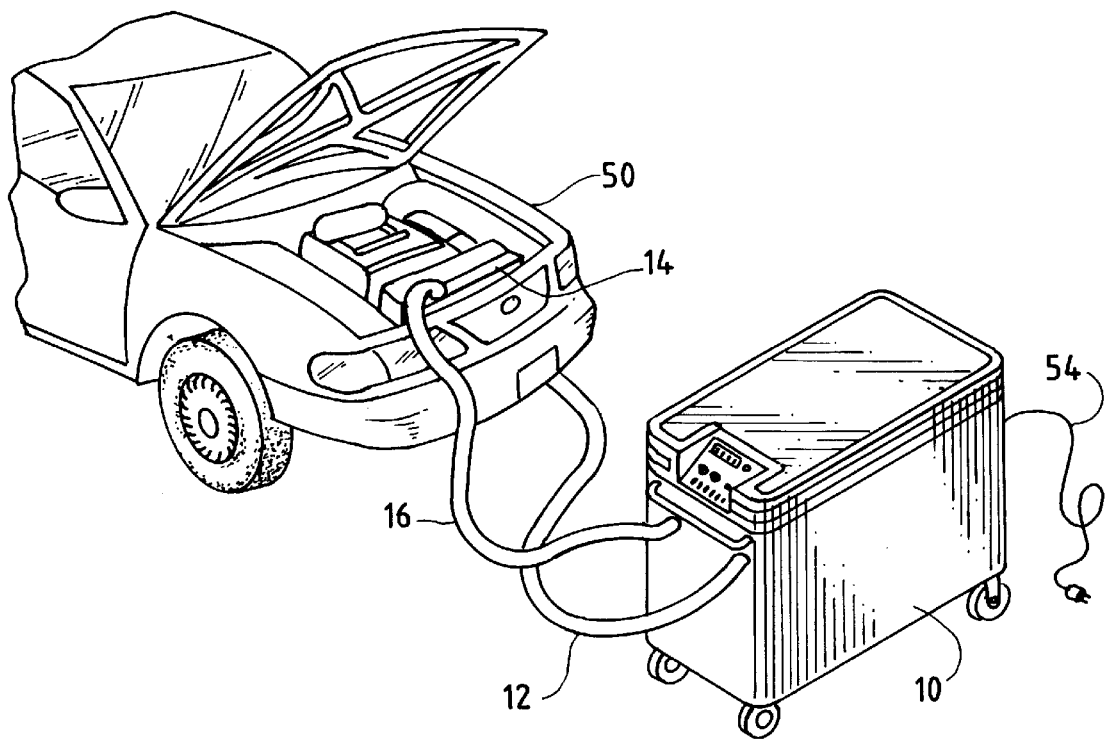
FIG. 5 depicts an apparatus of this invention embodying the schematic process of FIG. 1 as it would be associated with an automobile radiator in order to apply a coating of fluoropolymer onto the internal surfaces of the radiator.

FIG. 5 shows an apparatus of this invention located in wheeled housing 52 and associated with radiator 14 of automobile 50. It is anticipated that the apparatus will be used in garages and oil changing facilities to provide a radiator coating option to consumers.

According to FIG. 5, first and second flexible hoses 12 and 16 are attached to the correct inlet and outlet fittings on the automobile radiator. Circulation device 10 is then connected by cord 54 to an electrical outlet. The make and model of the vehicle is determined and entered into a programmable controller. The programmable controller automatically determines the proper amount of treatment fluid to introduce into the radiator and it controls the entire coating procedure automatically. The operator makes the necessary setting and pushes the start button. The machine goes through the flushing cycle to clean the radiator, then a drain cycle followed by a hot air drying cycle. The fluoropolymer solution is introduced in concentrate form and then a diluting solution is used to fill the system and the fluoropolymer solution is circulated for a specified period. The fluoropolymer solution is then drained into a holding tank and then hot air is circulated through the radiator to cure the fluoropolymer and bond it to the radiator core as a film. The circulation device automatically shuts off. The operator then removes the two hoses and replaces the two radiator hoses. Finally, the cooling system is filled with the recommended amount of coolant.

EXAMPLE

In this Example, heated water and heated air was passed through three different radiator cores both before and after coating the internal surfaces of the radiator cores with a fluoropolymer. Heat transfer and fluid flow measurements were recorded for both the uncoated and fluoropolymer coated radiators.

Three similar clean aluminum radiator cores, Part No. 52471560 (w-car) manufactured by Delphi-Harrison Thermal Systems. The heat transfer and fluid dynamic properties of the uncoated radiator cores were evaluated by passing air or water through the radiator cores at conditions set forth in Table I below. Heat transfer and fluid ΔP measurements for each radiator core are also reported in Table I.

TABLE I

| | | | | | | | | | | | | |
|---|---|---|---|---|---|---|---|---|---|---|---|---|
| | | RADIATORS TESTED BEFORE COATING | | | | | | | | | | |
| Description | Units | Core #1 | | | | | | | | Core #2 | | Core #3 |
| Air Mass Flow | lb/min | 416 | 288 | 192 | 96 | 416 | 280 | 192 | 96 | 416 | 192 | 416 |
| Water Mass Flow | lb/min | 162 | 162 | 162 | 162 | 325 | 325 | 325 | 325 | 324 | 325 | 325 |
| Air Inlet Temp. | ° F. | 81 | 81 | 82 | 81 | 81 | 81 | 81 | 81 | 80 | 81 | 81 |
| Water Inlet Temp. | ° F. | 180 | 180 | 180 | 180 | 180 | 180 | 180 | 180 | 180 | 181 | 181 |
| Water-Side ΔP | psi | 2.88 | 2.87 | 2.86 | 2.85 | 10.93 | 10.97 | 10.97 | 11.01 | 11.05 | 11.08 | 11.21 |
| Air-Side ΔP | iN H$_2$O | 0.88 | 0.49 | 0.28 | 0.11 | 0.90 | 0.51 | 0.29 | 0.11 | 0.94 | 0.30 | 0.93 |
| *Heat Transfer | Btu fusion | 3212 | 2761 | 2299 | 1553 | 3531 | 2981 | 2464 | 1612 | 3475 | 2404 | 3567 |

Each radiator was internally and externally coated with a fluoropolymer solution. The fluoropolymer solution used was a 3.0 weight percent solution of PTFE dissolved in performance fluid 5080 manufactured by the 3M Company. The cores were coated by plugging all radiator holes, filling up the radiator cores completely with the fluoropolymer solution and then draining the fluoropolymer solution from the radiator cores. The radiator external surfaces were coated by applying a spray of fluoropolymer solution to the external radiator surfaces.

The internal fluoropolymer coated internal and external radiator surfaces were cured using a heat gun to blow air heated to from about 100–150° F. over the internal and external surfaces of the fluoropolymer coated radiator.

The heat transfer and fluid dynamic properties of the fluoropolymer coated radiator cores was then evaluated at the conditions set forth in Table II. Heat transfer and pressure drop data for each radiator core is reported in Table II, below.

TABLE II

RADIATORS TESTED AFTER COATING

| Description | Units | Core #1 | | | | | | | | Core #2 | | Core #3 |
|---|---|---|---|---|---|---|---|---|---|---|---|---|
| Air Mass Flow | lb/min | 410 | 284 | 189 | 95 | 410 | 284 | 189 | 95 | 410 | 189 | 400 |
| Water Mass Flow | lb/min | 163 | 163 | 162 | 162 | 323 | 323 | 324 | 324 | 324 | 324 | 325 |
| Air Inlet Temp. | ° F. | 78 | 78 | 79 | 76 | 78 | 78 | 77 | 76 | 78 | 79 | 81 |
| Water Inlet Temp. | ° F. | 180 | 180 | 180 | 180 | 180 | 180 | 180 | 180 | 180 | 180 | 180 |
| Water-Side ΔP | psi | 2.83 | 2.83 | 2.78 | 2.82 | 10.88 | 10.79 | 10.68 | 10.66 | 10.27 | 10.26 | 11.08 |
| Air-Side ΔP | iN H₂O | 0.86 | 0.50 | 0.28 | 0.10 | 0.87 | 0.49 | 0.28 | 0.10 | 0.94 | 0.30 | 0.88 |
| *Heat Transfer | Btu fusion | 3212 | 2746 | 2267 | 1517 | 3516 | 2956 | 2426 | 1583 | 3459 | 2370 | 3540 |

Upon comparing the pre-coated radiator performance results reported in Table I performance with the coated radiator performance results reported in Table II, it can be seen that coating the internal surfaces of a radiator core with a fluoropolymer does not degrade the heat transfer properties or the fluid dynamic properties of the radiator cores. To the contrary, the coated radiator cores were able to achieve the same rate of heat transfer as the uncoated cores with a smaller fluid pressure drop across the radiator core.

What I claim is:

1. A method for applying a fluoropolymer coating to the internal surfaces of a heat exchanger that includes a hollow interior, a fluid inlet, and a fluid outlet, comprising the steps:
   a. directing a flushing solution into the heat exchanger inlet, through the hollow interior of the heat exchanger and out of the heat exchanger outlet to give a cleaned heat exchanger;
   b. removing the flushing solution from the cleaned hollow heat exchanger;
   c. introducing air into the cleaned hollow heat exchanger to give an essentially dry cleaned hollow heat exchanger;
   d. introducing a fluoropolymer solution into the essentially dry cleaned hollow heat exchanger and circulating the fluoropolymer solution through the cleaned hollow heat exchanger for a period of time sufficient to give a fluoropolymer coated heat exchanger;
   e. removing the fluoropolymer solution from the fluoropolymer coated heat exchanger; and
   f. introducing air into the fluoropolymer coated heat exchanger for a period of time sufficient to give a fluoropolymer film coated heat exchanger.

2. The method of claim 1 wherein the fluoropolymer solution includes from about 1 to about 20 weight percent fluoropolymer.

3. The method of claim 2 wherein the air introduced into the hollow heat exchanger in steps (c) and (f) is heated air.

4. The method of claim 3 wherein the air is heated to a temperature ranging from about 80 to about 250° F.

5. The method of claim 1 wherein the heat exchange surface is coated with a film of fluoropolymer having a thickness of from 0.1 to about 10.0 microns.

6. The method of claim 1 wherein the heat exchanger is an automobile radiator.

7. The method of claim 1 wherein a coagulant solution is circulated through the hollow heat exchanger interior immediately following drying step (c).

* * * * *